United States Patent
Lee et al.

(10) Patent No.: US 8,081,056 B2
(45) Date of Patent: Dec. 20, 2011

(54) SPIRAL INDUCTOR

(75) Inventors: Sheng-Yuan Lee, Taipei County (TW);
Hsiao-Chu Lin, Taipei County (TW)

(73) Assignee: Via Technologies, Inc., Hsin-Tien, Taipei (TW)

( * ) Notice: Subject to any disclaimer, the term of this patent is extended or adjusted under 35 U.S.C. 154(b) by 66 days.

(21) Appl. No.: 12/024,126

(22) Filed: Feb. 1, 2008

(65) Prior Publication Data

US 2009/0115562 A1  May 7, 2009

(30) Foreign Application Priority Data

Nov. 6, 2007  (TW) ............................ 96141810 A

(51) Int. Cl.
*H01F 27/28* (2006.01)
*H01F 27/29* (2006.01)
*H01F 5/00* (2006.01)

(52) U.S. Cl. ........ 336/222; 336/192; 336/200; 336/223; 336/232

(58) Field of Classification Search ............... 336/192, 336/200, 222, 223, 232
See application file for complete search history.

(56) References Cited

U.S. PATENT DOCUMENTS

| | | | | | |
|---|---|---|---|---|---|
| 3,688,232 | A | * | 8/1972 | Szatmari | 336/69 |
| 5,039,964 | A | * | 8/1991 | Ikeda | 333/181 |
| 5,363,081 | A | * | 11/1994 | Bando et al. | 336/200 |
| 5,610,433 | A | * | 3/1997 | Merrill et al. | 257/531 |
| 5,754,110 | A | * | 5/1998 | Appalucci et al. | 340/572.5 |
| 5,892,425 | A | * | 4/1999 | Kuhn et al. | 336/200 |
| 6,906,610 | B1 | * | 6/2005 | Okamoto et al. | 336/200 |
| 6,922,126 | B1 | * | 7/2005 | Okamoto et al. | 336/200 |
| 7,126,452 | B2 | * | 10/2006 | Teshima et al. | 336/200 |
| 7,215,217 | B2 | * | 5/2007 | Ezzeddine | 333/25 |
| 7,312,684 | B2 | * | 12/2007 | Aoki | 336/200 |
| 7,362,204 | B2 | * | 4/2008 | Concord et al. | 336/200 |
| 7,456,721 | B2 | * | 11/2008 | Chiu | 336/200 |
| 7,626,480 | B2 | * | 12/2009 | Lee | 336/200 |
| 2005/0068146 | A1 | * | 3/2005 | Jessie | 336/200 |
| 2006/0022787 | A1 | * | 2/2006 | Brennan et al. | 336/200 |
| 2006/0139138 | A1 | * | 6/2006 | Watanabe et al. | 336/200 |
| 2007/0045773 | A1 | * | 3/2007 | Mi et al. | 257/531 |
| 2007/0085649 | A1 | * | 4/2007 | Park | 336/200 |
| 2007/0247268 | A1 | * | 10/2007 | Oya et al. | 336/200 |
| 2008/0048816 | A1 | * | 2/2008 | Matsumoto et al. | 336/200 |

FOREIGN PATENT DOCUMENTS

CN  101064271  10/2007

OTHER PUBLICATIONS

CN Office Action mailed Dec. 11, 2009.
English abstract of CN101064271, pub. Oct. 31, 2007.

* cited by examiner

*Primary Examiner* — Anh Mai
*Assistant Examiner* — Mangtin Lian
(74) *Attorney, Agent, or Firm* — Thomas|Kayden

(57) ABSTRACT

A spiral inductor is provided. The spiral inductor includes a first spiral conductive trace with at least one turn, a second spiral conductive trace, and a connector. The first spiral conductive trace comprises an outer end and an inner end. The second spiral conductive trace surrounds a portion of the outermost turn of the first spiral conductive trace, and comprises a first end and a second end. The connector electrically connects to the inner end and the first end.

20 Claims, 7 Drawing Sheets

SPIRAL INDUCTOR

BACKGROUND OF THE INVENTION

1. Field of the Invention

The invention relates to an inductor and more particularly to an inductor device with multi-layered interconnections.

2. Description of the Related Art

As shown in FIG. 1, for a 0.35-μm silicon process, a silicon oxide layer 3 is disposed on a p-well layer 2 on a silicon substrate 1. Three metal layers M1, M2, and M3 are embedded in the silicon oxide layer 3, and the top metal layer M3 is exposed on an upper surface of the silicon oxide layer 3. A silicon nitride layer 4 covers the silicon oxide layer 3 and the metal layer M3. The metal layer M3 is the thickest of the three metal layers M1, M2, and M3, and thus, the conductivity thereof is higher than the other two metal layers. Further, the metal layer M3 also comprises a conductor loss lower than those of the other two metal layers. As a result, the metal layer M3 is suitable for RF (radio frequency) low-loss component designs.

FIG. 2 is a top view of a conventional three-turn inductor 5. The magnetic flux is largest on the innermost turn 6 of the inductor 5, and thus, the induced eddy current on the innermost turn 6 causes the current density of the innermost turn 6 to be very non-uniform. That is, the current that is flowing concentrates at the inner part of the innermost turn 6, and the effective cross-section for the current flow slashes, negatively affecting the performance of the inductor 5 and reducing the quality factor (Q value) thereof. Further, when the frequency of the electronic signal becomes higher, the inductor 5 suffers more negative influence to the quality factor.

BRIEF SUMMARY OF THE INVENTION

Embodiments of the invention provide spiral inductors that prevent or reduce non-uniform current density in the inductors to improve the performance of the inductors and increase the quality factor of the inductors.

An embodiment of the invention further provides a spiral inductor comprising a first spiral conductive trace with at least one turn, a second spiral conductive trace, and a connector. The first spiral conductive trace comprises an outer end and an inner end. The second spiral conductive trace surrounds a portion of the outermost turn of the first spiral conductive trace, and comprises a first end and a second end. The connector electrically connects to the inner end and the first end.

An embodiment of the invention further provides a spiral inductor comprising an insulating layer, a first spiral conductive trace, a second spiral conductive trace, a first conductor, a second conductor, and a connection element. The insulating layer is disposed overlying a substrate. The first spiral conductive trace, with at least one turn, is disposed in the insulating layer. The first spiral conductive trace comprises an outer end and an inner end. The second spiral conductive trace, comprising a first end and a second end, is disposed in the insulating layer and surrounds a portion of the outermost turn of the first spiral conductive trace. The first spiral conductive trace and the second spiral conductive trace belong to the same wiring layer. The first conductor is electrically connected to the inner end and protrudes from the first spiral conductive trace. The second conductor is electrically connected to the first end and protrudes from the second spiral conductive trace in a direction substantially the same as a protruding direction of the first conductor. The connection element electrically connects to the first conductor and the second conductor. The connection element and the first spiral conductive trace belong to different wiring layers.

Further scope of the applicability of the invention will become apparent from the detailed description given hereinafter. It should be understood; however, that the detailed description and specific examples, while indicating preferred embodiments of the invention, are given by way of illustration only, as various changes and modifications within the spirit and scope of the invention will become apparent to those skilled in the art from this detailed description.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

In the subsequent description, phrases such as "substantially uniform", "substantially parallel with", "substantially equal", and "substantially the same" etc . . . means expected to be uniform, parallel with, equal, and the same etc. in design, as in practice, it is difficult to be mathematically or geometrically uniform, parallel with, equal, and the same etc. Additionally, when deviation is in an acceptable range of a corresponding standard or specification, it is also recognized to be uniform, parallel with, equal, and the same etc. Those skilled in the art are expected to acknowledge, that different standards or specifications, depend upon various properties and conditions, and thus, cannot be specifically listed.

Figure 1:
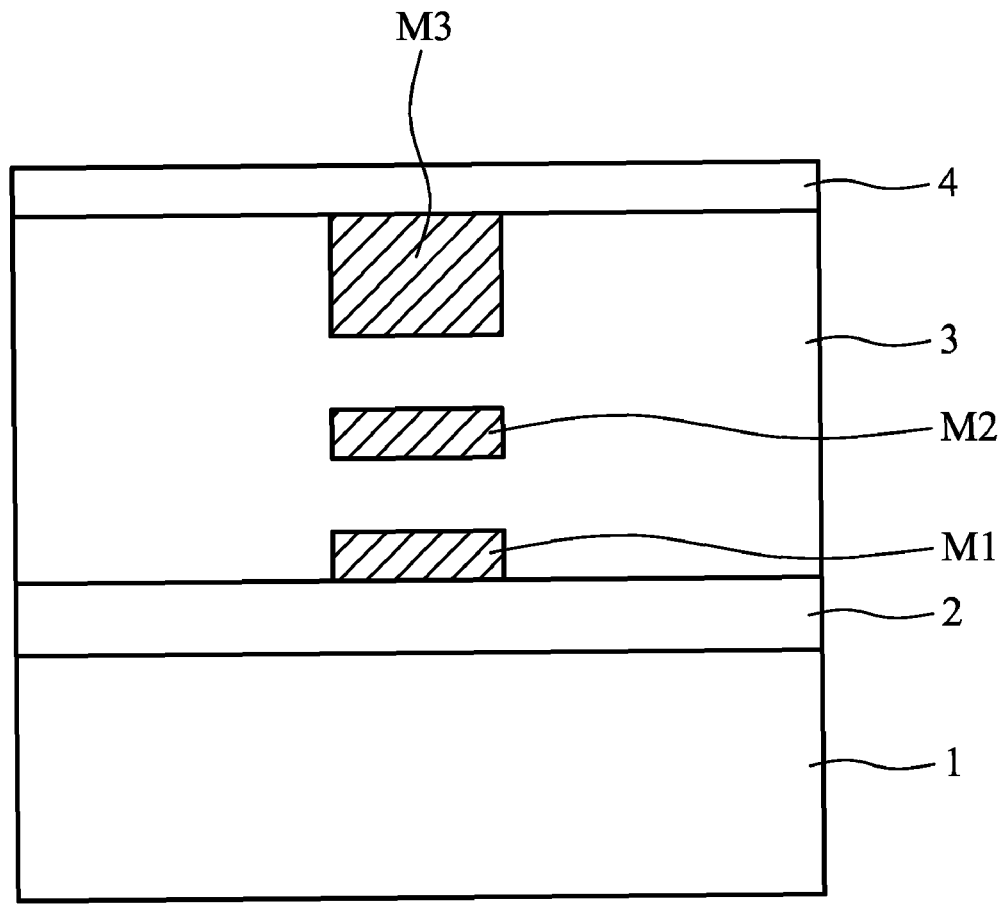
FIG. 1 is a cross-section of a conventional semiconductor device processed by a silicon process.
Figure 2:
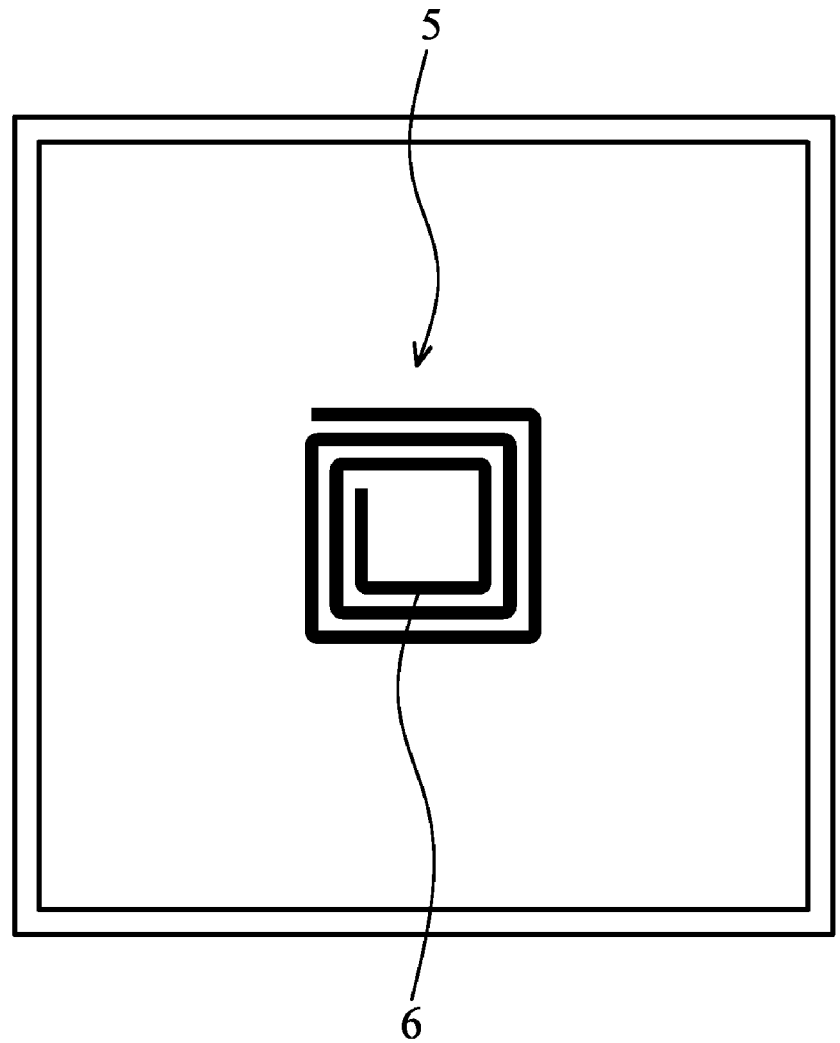
FIG. 2 is a top view of a conventional three-turn inductor.
Figure 3:
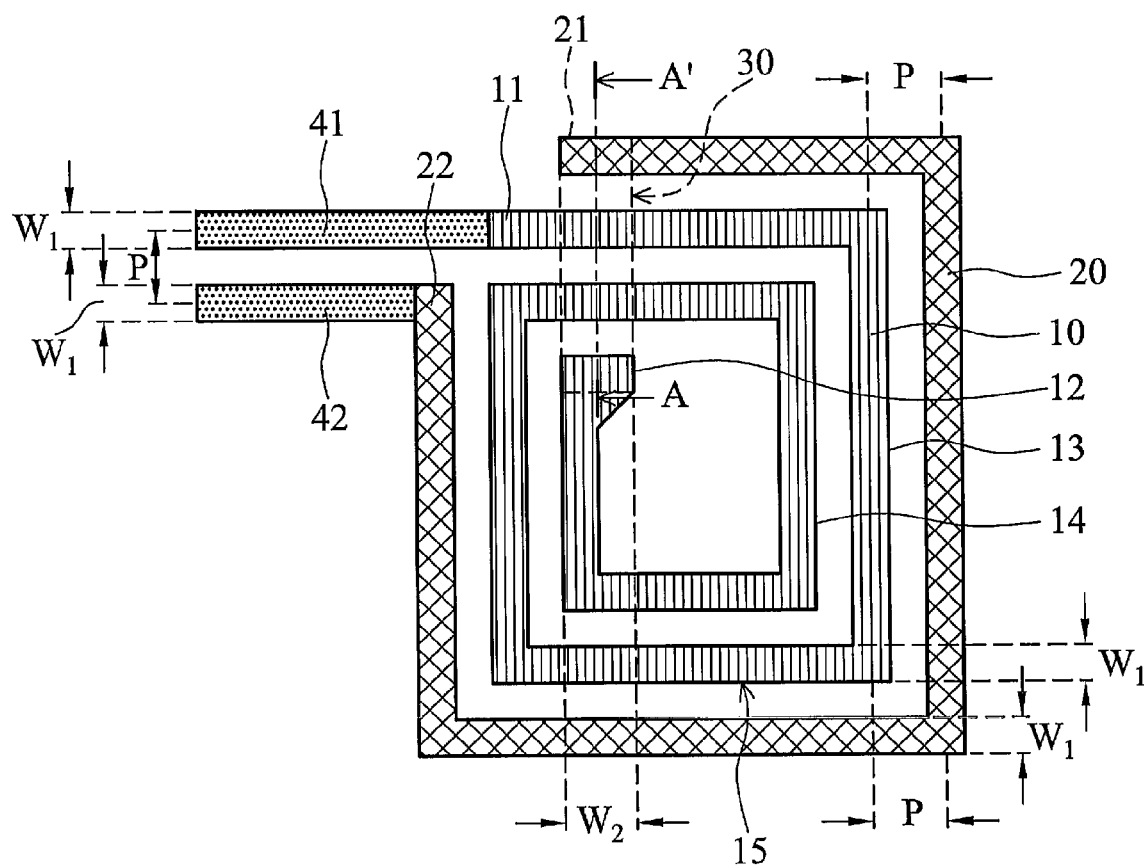
FIG. 3 is a top view of a spiral inductor of a preferred embodiment of the invention.

Referring to FIG. 3, a top view of a spiral inductor, comprising a spiral conductive trace 10, a spiral conductive trace 20, and a connector 30, of a preferred embodiment of the invention is shown.

The spiral conductive trace 10 is with at least one turn and comprises an outer end 11 and an inner end 12. All of the spiral conductive trace 10 may substantially be in the same plane or not in the same plane. The outer end 11 is the beginning of an outermost turn 13 and the inner end 12 is the end of the innermost turn 14, or in another point of view, the inner end 12 is the beginning of the innermost turn 14 and the outer end 11 is the end of the outermost turn 13. In this embodiment, the spiral conductive trace 10 spirally extends from the outer end 11 to the inner end 12 clockwise. In other embodiments, the spiral conductive trace 10 may extend counterclockwise. In FIG. 3, the spiral conductive trace 10 comprises two turns, but may comprise more turns as required. The spiral conductive trace 10 may comprise integral turns or non-integral turns. Further, the spiral conductive trace 10 may comprise a round, elliptic, rectangular, hexagonal, octagonal, or polygonal profile, but comprises a rectangular profile as shown in the preferred embodiment in FIG. 3.

The spiral conductive trace 20 surrounds a portion of the outermost turn 13 of the spiral conductive trace 10, and may surround the whole outermost turn 13 of the spiral conductive trace 10. The spiral conductive trace 20 comprises an end 21 and an end 22. All of the spiral conductive trace 20 may be substantially in the same plane or not in the same plane. When all of the spiral conductive trace 10 is substantially in the same plane, the spiral conductive trace 20 may be substantially in the same plane as the spiral conductive trace 10, or in a different plane from the spiral conductive trace 10. Further, the spiral conductive trace 20 does not extend into a region 15 surrounded by the spiral conductive trace 10. Moreover, the profile of the spiral conductive trace 20 depends on that of the spiral conductive trace 10 because the spiral conductive trace 20 surrounds the outermost turn 13 of the spiral conductive trace 10.

The connector 30 electrically connects to the inner end 12 and the end 21, and does not contact the spiral conductive traces 10 and 20 except for the inner end 12 and the end 21. The connector 30 may be disposed over or under the spiral conductive traces 10 and 20, for example, or may be disposed in any way that does not contact the spiral conductive traces 10 and 20 except for the inner end 12 and the end 21. In various applications of the spiral inductor of a preferred embodiment of the invention, the connector 30 may comprise various kinds of detailed structures, such as those in the subsequent descriptions for FIGS. 4 through 7.

The spiral inductor of a preferred embodiment of the invention may optionally comprise I/O (input/output) ports 41 and 42 as required. The I/O port 41 electrically connects to the outer end 11 and extends farther away from the spiral conductive trace 10. The I/O port 42 electrically connects to the end 22 and extends farther away from the spiral conductive trace 20. The extending directions of the I/O ports 41 and 42 may be substantially in parallel or not, but are substantially in parallel as shown in FIG. 3.

The spiral conductive trace 20 shown in FIG. 3 is less than, but almost one turn, and thus, the I/O port 41 is closed to the I/O port 42. In other embodiments, the spiral conductive trace 20 may be three fourths of one turn, half of one turn, or n of one turn, wherein n is any positive number less than 1, and thus, the I/O ports 41 and 42 are apart. Further, the spiral conductive trace 20 may surround a portion of the outermost turn 13 of the spiral conductive trace 10, or surround the whole outermost turn 13 of the spiral conductive trace 10.

In practice, the materials and dimensions of the spiral conductive traces 10 and 20 are preferably substantially uniform to calculate and control the inductance and other performances of the spiral inductor of a preferred embodiment of the invention. The preferred dimensions of the subsequently described spiral inductor may be utilized in the subsequently described applications or other applications modified by those skilled in the art. Further, for the convenience of the description, the dimensions may be shown by unknown numbers, which means the values of the dimensions can be adjustable as required.

The spiral conductive traces 10 and 20 are substantially located in the same plane, and can be simultaneously formed by patterning a wiring layer, for example. The spiral conductive trace 10 comprises a substantially uniform width $W_1$, and the width in some parts of the spiral conductive trace 10 can be variable as required. For example, the width of the inner end 12 may gradually increase from $W_1$ to $W_2$, wherein $W_2$ is greater than $W_1$. Further, pitches between neighboring turns of the spiral conductive trace 10 are substantially uniform and comprise a value P. In other embodiments, the inner end 12 may be as wide as the spiral conductive traces 10 and 20 of a value $W_1$ (not shown).

The spiral conductive trace 20 also preferably comprises a substantially uniform width, and the width thereof is more preferably substantially equal to $W_1$, of the spiral conductive trace 10. The optional I/O ports 41 and 42 may be substantially in the same plane, or in different planes. In a preferred embodiment, the I/O ports 41 and 42 may be substantially in the same plane as the spiral conductive traces 10 and 20, and are formed simultaneously with the spiral conductive traces 10 and 20 by the same patterning step. The I/O ports 41 and 42 preferably comprise substantially uniform width, and the values thereof are more preferably substantially equal to W1, of the spiral conductive trace 10.

The spiral conductive trace 20 is preferably substantially parallel with the outermost turn 13 of the spiral conductive trace 10, and a pitch between the spiral conductive trace 20 and the outermost turn 13 of the spiral conductive trace 10 is more preferably substantially the same as the value P of the patch values between the neighboring turns of the spiral conductive trace 10. A pitch between the optional I/O ports 41 and 42 may be substantially the same as the value P of the patch values between the neighboring turns of the spiral conductive trace 10, or other values greater than P.

Next, applications utilizing the spiral inductor of a preferred embodiment of the invention as a built-in inductor in a chip are shown. An exemplary cross-sectional structure, corresponding to a cross-sectional structure along line AA' in FIG. 3, of one of the applications is shown in FIG. 4.

Figure 4:
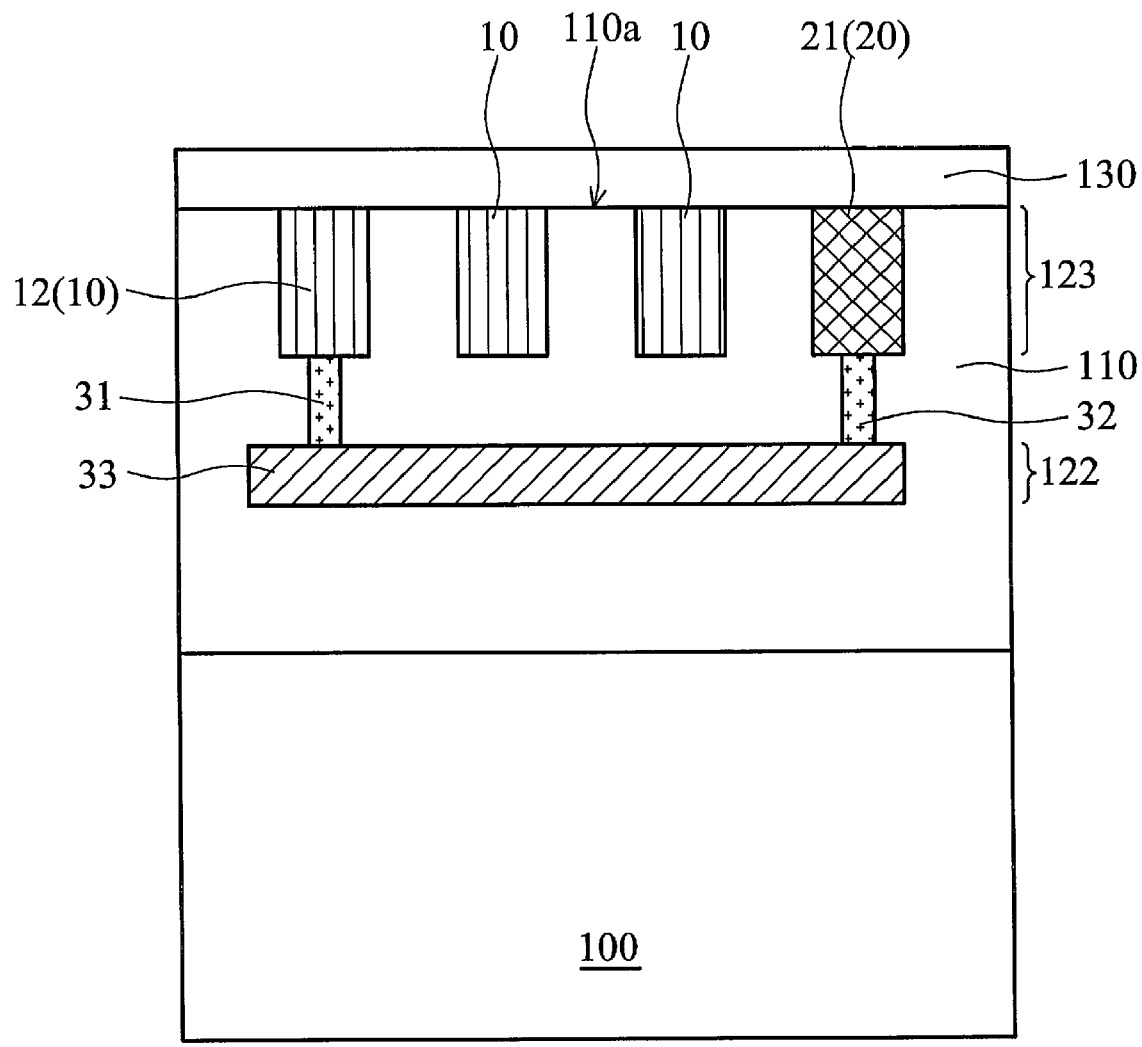
FIG. 4 shows an exemplary cross-sectional structure of a spiral inductor of a preferred embodiment of the invention.

In FIG. 4, an insulating layer 110 is disposed overlying a substrate 100. In the application of the chip, with a built-in inductor, the substrate 100 comprises a silicon substrate or other known semiconductor substrates. Further, the substrate may comprise various components such as transistors, resistors, or other typical semiconductor components. Moreover, the substrate may comprise other conductive layers (such as copper, aluminum, or alloys thereof) and insulating layers (such as silicon oxide layers, silicon nitride layers, or low dielectric constant layers). For clarity, only a flat substrate 100 is shown.

The insulating layer 110 is typically a multi-layered film comprising a plurality of dielectric films, and wiring layers 122 and 123 of an interconnection system are embedded in two of the films of the insulating layer 110. For clarity, only a flat insulating layer 110 is shown.

In FIG. 4, the spiral conductive traces 10 and 20 belong to the same top wiring layer 123. The wiring layer 123 is the thickest of all the wiring layers, and thus, comprises the highest conductivity and the lowest conductor loss to be suitable for RF (radio frequency) low-loss component design. In other embodiments, the spiral conductive traces 10 and 20 may be disposed in other lower wiring layers, such as the wiring layer 122.

In this embodiment, the spiral conductive traces 10 and 20 belong to the same top wiring layer 123, so the connector 30 (as shown in FIG. 3) electrically connecting the inner end 12 and the end 21 is disposed under the spiral conductive traces 10 and 20. The connector 30 (as shown in FIG. 3) comprises a conductor 31, a conductor 32, and a connection element 33.

The conductor 31 electrically connects to the inner end 12 and protrudes from the spiral conductive trace 10. The conductor 32 electrically connects to the end 21 and protrudes from the spiral conductive trace 20, and the protruding direction thereof is substantially the same as that of the conductor 31. In this embodiment, the conductors 31 and 32 are plugs disposed in the insulating layer 110, respectively under the inner end 12 and the end 21. The connection element 33 electrically connects to the conductors 31 and 32 and belongs to a wiring layer different from the spiral conductive trace 10. In this embodiment, the connection element 33 is disposed in the wiring layer 122 under the wiring layer 123, or the so-called "underpass". In the other embodiments, the connection element 33 may be disposed in a next wiring layer (not shown) under the wiring layer 122, and the routing of the wiring layer 122 is prevented from extending into the predetermined regions for the conductors 31 and 32, preventing electrical contact thereto, allowing the conductors 31 and 32 to directly extend downward and electrically connect to the connection element 33 in the next wiring layer under the wiring layer 122. In yet other embodiments, the connection element 33 may be disposed in other lower wiring layers (not shown) than the wiring layer 122, and the routing of all the wiring layers between the spiral conductive traces 10, 20 and the connection element 33 will also be prevented from extending into the predetermined regions for the conductors 31 and 32, preventing electrical contact thereto, allowing the conductors 31 and 32 to directly extend downward and electrically connect to the connection element 33.

Further, when the spiral conductive traces 10 and 20 are disposed in other lower wiring layers, the connection element 33 may be disposed in their lower or upper wiring layers, and plugs like the conductors 31 and 31 can be utilized to complete the electrical connection between the inner end 12 and the end 21.

Moreover, when the built-in inductor optionally comprises the I/O ports 41 and 42, the I/O ports 41 and 42 may be disposed in the same wiring layer 123 where the spiral conductive traces 10 and 20 are disposed, although it is not shown in FIG. 4, and directly and electrically connect to the outer end 11 and the end 22 (see FIG. 3). In other embodiments, the I/O ports 41 and 42 may be disposed in a wiring layer different from that where the spiral conductive traces 10 and 20 are disposed, and structures like the conductors 31 and 32 may be utilized for electrical connection to the outer end 11 and the end 22 (see FIG. 3).

The structure shown in FIG. 4 is an exemplary cross-sectional structure of one of the applications of the spiral inductor of a preferred embodiment of the invention which is utilized as a chip, with a built-in inductor, but may be applied to other devices comprising multi-layered interconnections such as printed circuit boards (PCBs) utilized as packaging substrates or motherboards of electronic products, or multi-layered leadframes for packaging substrates. In such applications, the substrate 100 is a core substrate of the device, and a passivation layer 130 overlying the insulating layer 110 is utilized as a solder mask.

For the embodiments of the spiral inductors of the invention, the connector 30 (as shown in FIG. 3) is an important element sequentially connecting the spiral conductive traces 10 and 20 to complete formation of the spiral inductor. In other applications, only the spiral conductive traces 10 and 20 are formed in an interconnection system, and it is not necessary to form the connector 30 (as shown in FIG. 3) in the same interconnection system. For these applications, the spiral inductor of a preferred embodiment of the invention is completed by connection of the interconnection system with an external device which electrically connects to the spiral conductive traces 10 and 20.

Figure 5:
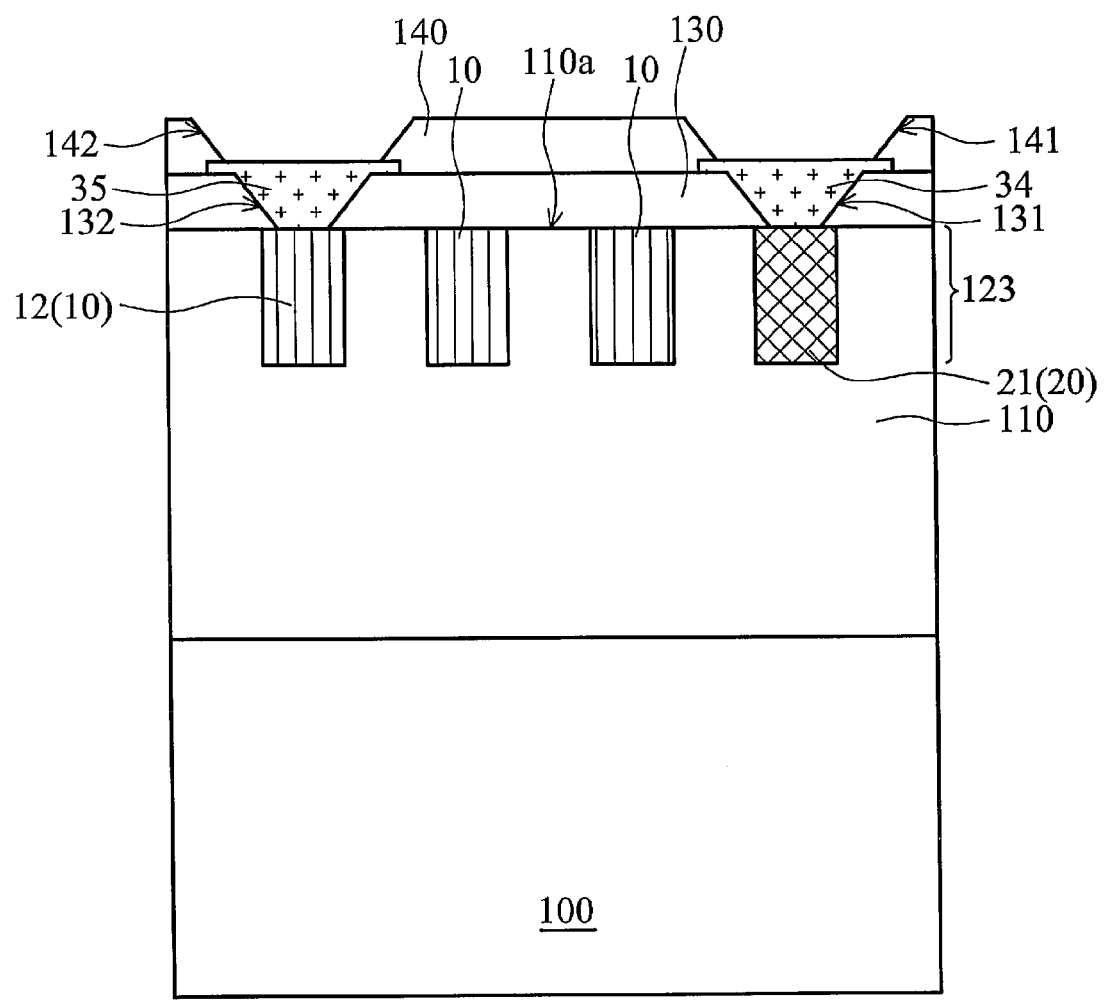
FIG. 5 shows another exemplary cross-sectional structure of a spiral inductor of a preferred embodiment of the invention

For the chip, with a built-in inductor as shown in FIG. 4, a PCB built-in inductor, or a leadframe built-in inductor, for example, the electrical connection between the inner end 12 of the spiral conductive trace 10 and the end 21 of the spiral conductive trace 20 may not be along the lower wiring layer, but an external device over the spiral conductive traces 10 and 20. Thus, the spiral inductor of a preferred embodiment of the invention can not only be applied in a device comprising multi-layered interconnection system, but also applied in a device comprising a single-layered interconnection system, such as a PCB for packaging substrate or leadframe comprising one wiring layer. A cross-sectional structure of one of the examples of the device comprising a single-layered interconnection system is shown in FIG. 5, and the top view thereof also is shown in FIG. 3. That is, FIG. 5 is also cross-section along line AA' in FIG. 3.

The spiral conductive traces 10 and 20, the inner end 12, the end 21, the substrate 100, the insulating layer 110 with the upper surface 110a thereof, the wiring layer 123, and the passivation layer 130 shown in FIG. 5 are substantially the same as or similar with those shown in FIG. 4, and detailed descriptions are omitted for brevity. In other embodiments, the interconnection system comprises only a single wiring layer 123, or comprises one or more wiring layers under the single wiring layer 123.

In FIG. 5, the upper surfaces of the spiral conductive traces 10 and 20 are exposed in the upper surface 110a of the insulating layer 110, and openings 131 and 132 may be formed in the passivation layer 130 to respectively expose the end 21 and the inner end 12 in order to form pads 34 and 35, respectively electrically connecting to the end 21 and the inner end 12. At this time, it is preferred that a suitable design is implemented for the end 21 and the inner end 12 to be disposed in a suitable position for formation of the pads 34 and 35. After the formation of the pads 34 and 35, an optional passivation layer 140 may be formed overlying the passivation layer 130 and pads 34, 35, followed by formation of openings 141 and 142, respectively exposing the pads 34 and 35.

Next, applications for formation of electrical connection between the inner end 12 of the spiral conductive trace 10 and the end 21 of the spiral conductive trace 20 are described.

Figure 6:
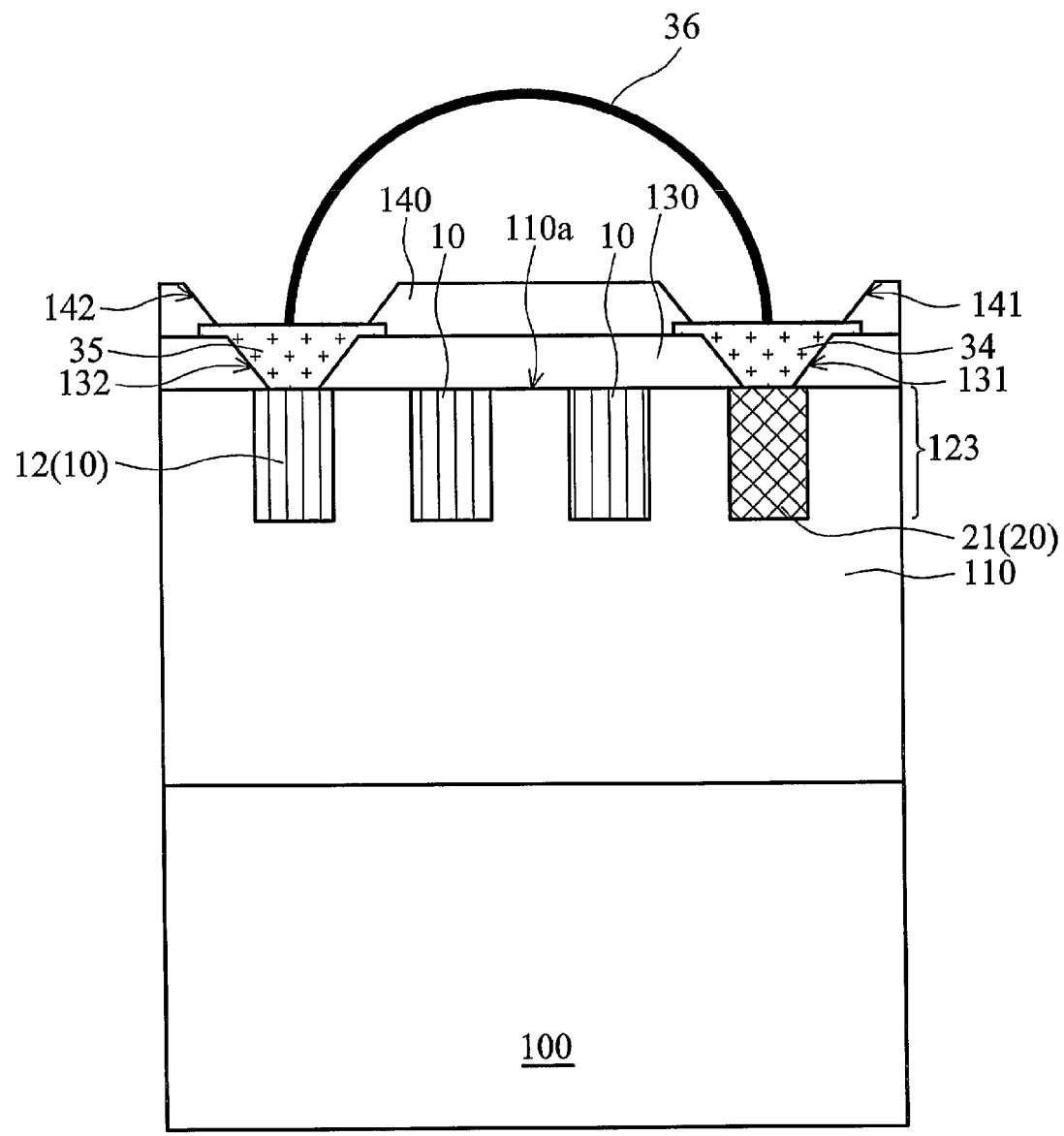
FIG. 6 is a cross-section of a variation of the spiral inductor shown in FIG. 5.

In FIG. 6, for example, a bonding wire 36 electrically connecting the pads 34 and 35, can be formed by wire bonding technology, thus, completing the electrical connection between the inner end 12 of the spiral conductive trace 10 and the end 21 of the spiral conductive trace 20. At this time, the pads 34 and 35 can be utilized as conductors, and the bonding wire 36 can be utilized as a connection element, constructing the connector 30 shown in FIG. 3.

Figure 7:
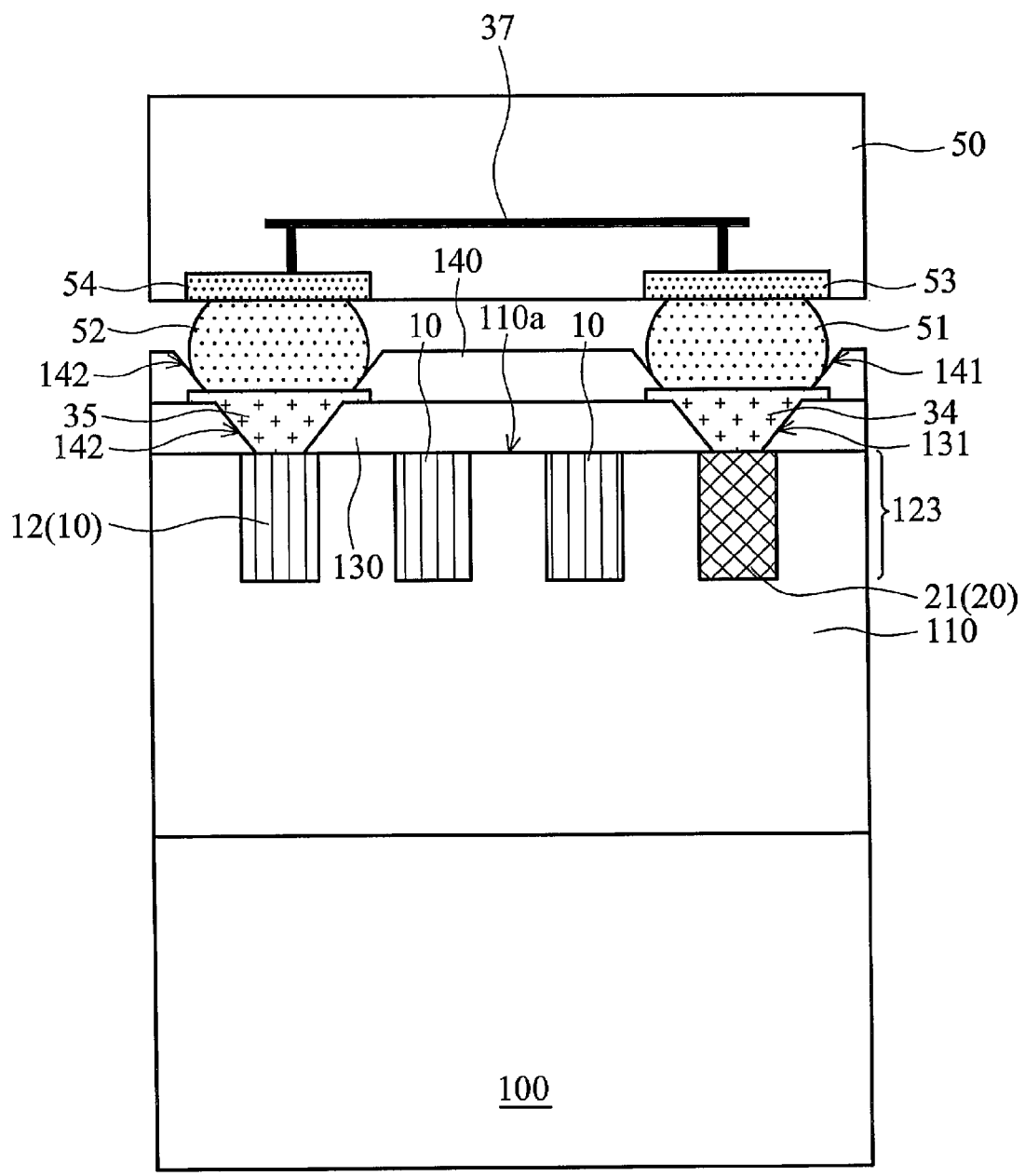
FIG. 7 is another cross-section of a variation of the spiral inductor shown in FIG. 5.

In the other application as shown in FIG. 7, an external device 50, comprising terminals 53, 54 and a connection element 37 electrically connecting the terminals 53 and 54, can be provided. The external device 50 can be a PCB, a packaging substrate, a semiconductor chip, a passive device, or other devices comprising internal circuits, depending on the type of the interconnection system shown in FIG. 5, such as a semiconductor chip, a PCB, a leadframe, or other devices.

Next, the electrical connection between the inner end 12 of the spiral conductive trace 10 and the end 21 of the spiral conductive trace 20 is completed by a conductive bump 51 electrically connecting the pad 34 and the terminal 53, and a conductive bump 52 electrically connecting the pad 35 and the terminal 54. At this time, the pads 34 and 35 can be utilized as conductors, and a combination of the conductive bump 51, the terminal 53, the connection element 37, the terminal 54, and the conductive bump 52 can be utilized as a connection element, constructing the connector 30 shown in FIG. 3.

In yet another application, bonding wire structures like the bonding wire 36 may replace the conductive bumps 51 and 52 shown in FIG. 7, and thus, the external device 50 may not be over the spiral conductive traces 10 and 20, but under or on the side of the substrate 100.

One of the characteristics of the spiral inductor of the preferred embodiment of the invention is that the spiral conductive trace 20 replaces the innermost turn of a conventional spiral inductor, to prevent or decrease non-uniform current density in the inductor, improving the performance of the inductor and increasing the quality factor (Q value) of the inductor.

The preferred embodiment of the invention provides several advantages. First, the spiral inductor of the preferred embodiment of the invention can be fabricated by a standard silicon process. Further, a controlled experiment shows that the quality factor (Q value) of the inductor of the preferred embodiment of the invention is higher than that of a conventional inductor. Further, the fabrication of the spiral inductor of the preferred embodiment of the invention does not require any special processes. Moreover, the practice of the spiral inductor of the preferred embodiment of the invention guarantee the performance of a design RF system and the cost thereof can be reduced.

While the invention has been described by way of example and in terms of preferred embodiment, it is to be understood that the invention is not limited thereto. To the contrary, it is intended to cover various modifications and similar arrangements (as would be apparent to those skilled in the Art). Therefore, the scope of the appended claims should be accorded the broadest interpretation so as to encompass all such modifications and similar arrangements.

What is claimed is:

1. A spiral inductor, comprising:
   a first spiral conductive trace with at least one turn, wherein the first spiral conductive trace comprises an outer end and an inner end;
   a second spiral conductive trace, comprising a first end and a second end, surrounding a portion of the outermost turn of the first spiral conductive trace, wherein the second spiral conductive trace does not extend into a region surrounded by the first spiral conductive trace and no other spiral conductive trace is formed between the first spiral conductive trace and the second spiral conductive trace;
   a connector, electrically connecting the inner end and the first end, wherein the first spiral conductive trace, except for the inner end, comprises a substantially uniform width $W_1$, and the inner end comprises a width $W_2$ greater than $W_1$ and wherein the connector comprises the substantially uniform width $W_2$;
   a first I/O port, electrically connected to the outer end and extending farther away from the first spiral conductive trace; and
   a second I/O port, electrically connected to the second end and extending farther away from the second spiral conductive trace, wherein the first I/O port and the second I/O port are between the inner end and first end.

2. The inductor as claimed in claim 1, wherein the second spiral conductive trace does not contact the first spiral conductive trace.

3. The inductor as claimed in claim 1, wherein the second spiral conductive trace surrounds substantially the whole outermost turn of the first spiral conductive trace.

4. The inductor as claimed in claim 1, wherein a width of the inner end gradually increases from the width $W_1$ to the width $W_2$.

5. The inductor as claimed in claim 1, wherein the first spiral conductive trace has at least two turns, and the first spiral conductive trace and the second spiral conductive trace have at least three turns.

6. The inductor as claimed in claim 1, wherein the connector is disposed underlying the first spiral conductive trace and the second spiral conductive trace, and the connector passes through at least two turns of the first spiral conductive trace and the second spiral conductive trace.

7. A spiral inductor, comprising:
   an insulating layer, disposed overlying a substrate;
   a first spiral conductive trace, with at least one turn, disposed in the insulating layer, wherein the first spiral conductive trace comprises an outer end and an inner end;
   a second spiral conductive trace, comprising a first end and a second end, disposed in the insulating layer and surrounding a portion of the outermost turn of the first spiral conductive trace, and the first spiral conductive trace and the second spiral conductive trace belong to one wiring layer, wherein the second spiral conductive trace does not extend into a region surrounded by the first spiral conductive trace and no other spiral conductive trace is formed between the first spiral conductive trace and the second spiral conductive trace;
   a first conductor, electrically connected to the inner end and protruding from the first spiral conductive trace;
   a second conductor, electrically connected to the first end and protruding from the second spiral conductive trace in a direction substantially the same as a protruding direction of the first conductor;
   a connection element, electrically connecting the first conductor and the second conductor, wherein the connection element and the first spiral conductive trace belong to different wiring layers, wherein the first spiral conductive trace, except for the inner end, comprises a substantially uniform width $W_1$, and the inner end comprises a width $W_2$ greater than $W_1$ and wherein the connector element comprises the substantially uniform width $W_2$;
   a first I/O port, electrically connected to the outer end and extending farther away from the first spiral conductive trace; and
   a second I/O port, electrically connected to the second end and extending farther away from the second spiral conductive trace, wherein the first I/O port and the second I/O port are between the inner end and first end.

8. The inductor as claimed in claim 7, wherein
   the first conductor and the second conductor, are plugs disposed in the insulating layer; and
   the connection element, is disposed in a wiring layer underlying the first conductor and the second conductor.

9. The inductor as claimed in claim 7, wherein the first conductor and the second conductor are pad structures disposed overlying the insulating layer.

10. The inductor as claimed in claim 9, wherein the connection element is a bonding wire.

11. The inductor as claimed in claim 7, further comprising an electronic component electrically connecting the first conductor and the second conductor, wherein the electronic component comprises the connection element.

12. The inductor as claimed in claim 7, wherein the first I/O port, the second I/O port, the first spiral conductive trace, and the second spiral conductive trace belong to the same wiring layer.

13. The inductor as claimed in claim 7, wherein the substrate is selected from a group consisting of a semiconductor substrate, a core substrate of a leadframe, and a core substrate of a printed circuit board.

14. The inductor as claimed in claim 7, wherein the second spiral conductive trace does not contact the first spiral conductive trace.

15. The inductor as claimed in claim 7, wherein the second spiral conductive trace surrounds substantially the whole outermost turn of the first spiral conductive trace.

16. The inductor as claimed in claim 7, wherein the first spiral conductive trace has at least two turns, and the first spiral conductive trace and the second spiral conductive trace have at least three turns.

17. The inductor as claimed in claim 7, wherein the connector is disposed underlying the first spiral conductive trace and the second spiral conductive trace, and the connector passes through at least two turns of the first spiral conductive trace and the second spiral conductive trace.

18. An inductor, comprising:
 a first spiral conductive comprising an outer end and an inner end;
 a second spiral conductive trace comprising a first end and a second end, the second end surrounding substantially all of the outermost turn of the first spiral conductive trace such that the second spiral conductive trace does not overlap an I/O port connected to the outer end of the first spiral conductive trace, wherein the second spiral conductive trace does not extend into a region surrounded by the first spiral conductive trace;
 a connector, electrically connecting the inner end and the first end, wherein the first spiral conductive trace, except for the inner end, comprises a substantially uniform width $W_1$, and the inner end comprises a width $W_2$ greater than $W_1$ and wherein the connector comprises the substantially uniform width $W_2$;
 a first I/O port, electrically connected to the outer end and extending farther away from the first spiral conductive trace; and
 a second I/O port, electrically connected to the second end and extending farther away from the second spiral conductive trace, wherein the first I/O port and the second I/O port are between the inner end and first end.

19. The inductor as claimed in claim 18, wherein the first spiral conductive trace has at least two turns, and the first spiral conductive trace and the second spiral conductive trace have at least three turns.

20. The inductor as claimed in claim 18, wherein the connector is disposed underlying the first spiral conductive trace and the second spiral conductive trace, and the connector passes through at least two turns of the first spiral conductive trace and the second spiral conductive trace.

* * * * *